(12) United States Patent
Thompson et al.

(10) Patent No.: US 12,132,469 B2
(45) Date of Patent: Oct. 29, 2024

(54) GALVANICALLY ISOLATED DRIVER PACKAGE FOR SWITCH DRIVE CIRCUIT WITH POWER TRANSFER

(71) Applicant: Allegro MicroSystems, LLC, Manchester, NH (US)

(72) Inventors: Andrew Thompson, Cheshire (GB); Joe Duigan, Peymeinade (FR); Karl Rinne, Cork (GB)

(73) Assignee: Allegro MicroSystems, LLC, Manchester, NH (US)

( * ) Notice: Subject to any disclaimer, the term of this patent is extended or adjusted under 35 U.S.C. 154(b) by 241 days.

(21) Appl. No.: 17/336,005

(22) Filed: Jun. 1, 2021

(65) Prior Publication Data
US 2021/0376822 A1    Dec. 2, 2021

(30) Foreign Application Priority Data
Jun. 2, 2020  (GB) ..................... 2008310

(51) Int. Cl.
*H01F 27/28*  (2006.01)
*H01F 5/04*   (2006.01)
*H01F 17/00*  (2006.01)
*H01F 27/00*  (2006.01)
*H01F 27/02*  (2006.01)
(Continued)

(52) U.S. Cl.
CPC ........... *H03K 17/0424* (2013.01); *H01F 5/04* (2013.01); *H01F 17/00* (2013.01); *H01F 27/00* (2013.01); *H01F 27/02* (2013.01); *H01F 27/027* (2013.01); *H01F 27/28* (2013.01);
(Continued)

(58) Field of Classification Search
CPC .... H03K 17/0424; H03K 17/691; H01F 5/04; H01F 17/00; H01F 27/00; H01F 27/02; H01F 27/027; H01F 27/28; H01F 27/2895; H01F 27/40; H01F 41/04; H01F 2019/085; H01F 27/266; H01F 27/2804;
(Continued)

(56) References Cited

U.S. PATENT DOCUMENTS 5,959,846 A    9/1999  Noguchi et al.
6,181,130 B1   1/2001  Hoshi et al.
(Continued)

FOREIGN PATENT DOCUMENTS

JP    2001167941      6/2001
JP    2001167941 A    6/2001
(Continued)

OTHER PUBLICATIONS

Intention to Grant dated Mar. 15, 2023 for UK Patent Application No. GB2008310.1; 4 pages.
(Continued)

*Primary Examiner* — Tuyen T Nguyen
(74) *Attorney, Agent, or Firm* — DALY, CROWLEY, MOFFORD & DURKEE, LLP (57) ABSTRACT

The present application provides a packaged gate drive circuit having a transformer. The transformer which is used to transfer both signals and power from a primary side to a secondary side. The windings of the transformer are formed using a combination of tracks and wirebond wires. The transformer is positioned in a well formed using a first insulating material and covered with a second insulating material.

12 Claims, 4 Drawing Sheets

(51) Int. Cl.
  *H01F 27/40* (2006.01)
  *H01F 41/04* (2006.01)
  *H03K 17/0424* (2006.01)
  *H03K 17/691* (2006.01)

(52) U.S. Cl.
  CPC ......... *H01F 27/2895* (2013.01); *H01F 27/40* (2013.01); *H01F 41/04* (2013.01); *H03K 17/691* (2013.01)

(58) Field of Classification Search
  CPC ........... H01F 27/022; H01F 2027/2814; H01F 27/306; H01F 27/34
  See application file for complete search history.

(56) References Cited

U.S. PATENT DOCUMENTS

| | | | |
|---|---|---|---|
| 2005/0285262 A1* | 12/2005 | Knapp | H01L 24/48 257/E23.033 |
| 2016/0181004 A1 | 6/2016 | Li et al. | |

FOREIGN PATENT DOCUMENTS

| | | | |
|---|---|---|---|
| JP | 2002-501678 A | * | 1/2002 |
| JP | 2003234234 | | 8/2003 |
| JP | 2008072021 | | 3/2008 |
| TW | M480151 U | * | 6/2014 |

OTHER PUBLICATIONS

"Great Britain Search and Examination Report for parent GB 2008310.1 application, mailed Oct. 12, 2020, 8 pages."

Response to United Kingdom Examination Report dated Oct. 17, 2022 for UK Patent Application No. 2008310.1; Response filed on Jan. 17, 2023; 11 pages.

Great Britain Examination Report under Section 18(3) dated Oct. 17, 2022 for Great Britain Patent Application No. GB2008310.1; 4 pages.

* cited by examiner

GALVANICALLY ISOLATED DRIVER PACKAGE FOR SWITCH DRIVE CIRCUIT WITH POWER TRANSFER

CROSS-REFERENCE TO RELATED APPLICATION

This application claims priority benefit of United Kingdom Patent Application No. 2008310.1, filed Jun. 2, 2020 by Andrew Thompson et al. and titled "Galvanically Isolated Driver Package for Switch Drive Circuit with Power Transfer," which is incorporated herein by reference in its entirety.

FIELD

The present application relates to electronics and to switch drive circuits and more particularly to galvanically isolated switch circuits with power transfer from the switch driver input side to the switch side.

BACKGROUND

In the field of power electronics, switch drive circuits are employed to turn switches on and off.

Switches are commonly used in a wide variety of electronic system. Switches usually control the flow of current from a power source to a load. In contrast to controlled resistive devices used for example in linear amplifiers and linear regulators, switches are usually either turned on completely (reaching their lowest ON-state resistance), or turned off completely (reaching their highest OFF-state resistance). The controlling electrode of the switch, usually referred to as its gate (or base), is driven by a switch drive circuit, or sometimes also referred to as gate drive circuit. Switches are usually voltage-controlled, turning on when the gate voltage (relative to another electrode of the switch usually referred to as its source or emitter) exceeds a manufacturer-specific threshold voltage by a margin, and turning off when the gate voltage remains below the threshold voltage by a margin.

Switch drive circuits receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Key performance parameters of switch driver circuits include their capability to drive switches with low propagation delay in the presence of non-ideal switch parameters such as input gate capacitances and presence of parasitic negative feedback (e.g., Miller effect).

Switches are often employed in electronic systems where galvanic isolation must be used to prevent undesirable DC currents flowing from one side of an isolation barrier to the other. Galvanic isolation is commonly used to separate circuits in order to protect users from coming into direct contact with hazardous voltages. Galvanic isolation may also be used to intentionally separate electrical circuits with hazardous or safe voltages on both sides of the isolation barrier, in order to simplify circuit design, reduce cost or improve system performance.

It is a common situation that the control circuit and thus the switch driver inputs reside on one side of the galvanic isolation barrier, while the switch driven by the switch driver resides on the other side of the isolation barrier. In other words, the switch drive circuit crosses the isolation barrier, and hence often becomes a safety-critical component. Various transmission techniques are available for signals to be sent across galvanic isolation barriers including optical, magnetic and capacitive coupling techniques.

The present invention targets galvanically isolated switch drive circuits which transmit drive signal information across isolation barriers using magnetic coupling.

It is also well known that isolated switch drive circuits may also be advantageously employed in electronic systems where galvanic isolation is not actually strictly required. In those cases, the galvanic isolation feature of the switch drive circuit may simplify the circuit design where "floating switches" (i.e., switches with their reference electrode not connected to the controller ground) need to be driven. Floating switches are also sometimes referred to as "high side switches". The present galvanically isolated switch drive circuit may also be used to drive floating switches, and may be referred to as a "floating switch drive circuit" or "floating gate drive circuit" in those systems.

Galvanically isolated switch drive circuits have been used for a long time, and a variety of prior art solutions exist. Most of these rely on a separate means to transfer power and the switching signals across the galvanic isolation. For example, an isolated DC-DC converter may be employed to provide power transfer and an opto-coupler, capacitive coupling or a transformer used to transfer switching signals.

Another approach is described in related applications WO2019068932 and WO2018146161, which are co-assigned, the entire contents of which are herein incorporated by reference.

In this approach a single transformer is provided to transfer control signals and power across the galvanic barrier. The transmission of power through the transformer provides a new solution for isolated gate drivers. However, the transfer of power dictates that a magnetic core such as ferrite is used. At the same time, it is desirable that isolated gate drivers are provided as a discrete packaged component. Typically, this is completed by mounting the components making up the isolated gate drive on a substrate with a lead frame or contacts and covered with a shell and/or encapsulant.

Implementing a design for such isolated gate drivers introduces a number of constraints and in particular the manner of providing the transformer within the package of the isolated gate driver.

Providing a discrete transformer mounted on the substrate of the isolated gate driver package works well and allows ease of manufacturing. However, as pressures increase to reduce package size, it becomes difficult to shrink the transformer and at the same time achieve required isolation.

It will be appreciated that the design of a gate drive circuit is no trivial matter as such circuits are required to operate reliably and ensure that an isolation barrier is maintained. At the same time, there are factors such as common mode capacitance which are required to be considered.

Whilst a circuit designer could individually design each gate drive circuit they require for an application, it is beneficial to have a pre-packaged device which they can incorporate into their applications.

The design of such a pre-packaged device faces two opposing desires, the first to have a pre-packaged device that is as small as possible and the second to ensure that isolation requirements are satisfied.

The present application provides an isolated gate driver package which is compact, manufacturable using conventional manufacturing techniques in the electronics industry and at the same time ensures reliability, isolation requirements and environmental protection concerns.

SUMMARY OF THE INVENTION

The present application provides an isolated gate drive. The isolated gate drive has a transformer with a core, a primary winding and a secondary winding. Isolated gate drive has a substrate having a first major surface and a second major surface opposing the first major surface. A first insulating material provided on the substrate in combination with the first major surface of the substrate defines a well wherein the core is positioned within the well and one or both of the primary and secondary windings are partially formed by one or more wirebond wires bonded to landing zones on the first major surface within the well.

Suitably, a second insulating material covers the wirebond wires and core. The second insulating material may be softer than the first insulating material so as to reduce losses.

The core may be fixed to the first major surface with a first adhesive. Electrical connections to the gate drive may be provided by pads or other contacts provided on the second major surface of the substrate. Alternatively, a lead frame may be provided to provide electrical connections to the package.

The wirebond wires may be bare metal or insulated.

The windings may be completed by tracks buried within the substrate or provided on either of the first and second major surfaces. The use of buried tracks inherently provides insulation.

A primary side circuit is suitably provided. The primary side circuit is at least partially covered by the first insulating material. The primary side circuit suitably comprises a first integrated circuit mounted to the first major surface.

Similarly, a secondary side circuit may be provided wherein the secondary side circuit is at least partially covered by the first insulating material, which in turn may be a second integrated circuit mounted to the first major surface.

The primary side circuit is galvanically isolated from the secondary side circuit.

The gate drive is configured to pass both signals and power from the primary side circuit to the secondary side circuit using the transformer.

A cap may be provided to cover the first insulating material and extending to the substrate.

The application also provides a method for manufacturing an isolated gate drive comprising a transformer. The method comprises:

providing a substrate with landing zones on a first major surface in a well region;

providing insulation material on the first major surface of the substrate about the well region to define a well with the first major surface;

attaching a core of the transformer to the substrate in the well;

attaching wirebond wires to the landing zones on the first major surface of the substrate to partially define windings around the transformer, applying a second insulation material to cover the core and wirebond wires.

These and other embodiments and advantages will become clear from the detailed description which follows.

DETAILED DESCRIPTION OF THE DRAWINGS

The words comprises/comprising when used in this specification are to specify the presence of stated features, integers, steps or components but does not preclude the presence or addition of one or more other features, integers, steps, components or groups thereof.

Figure 1:
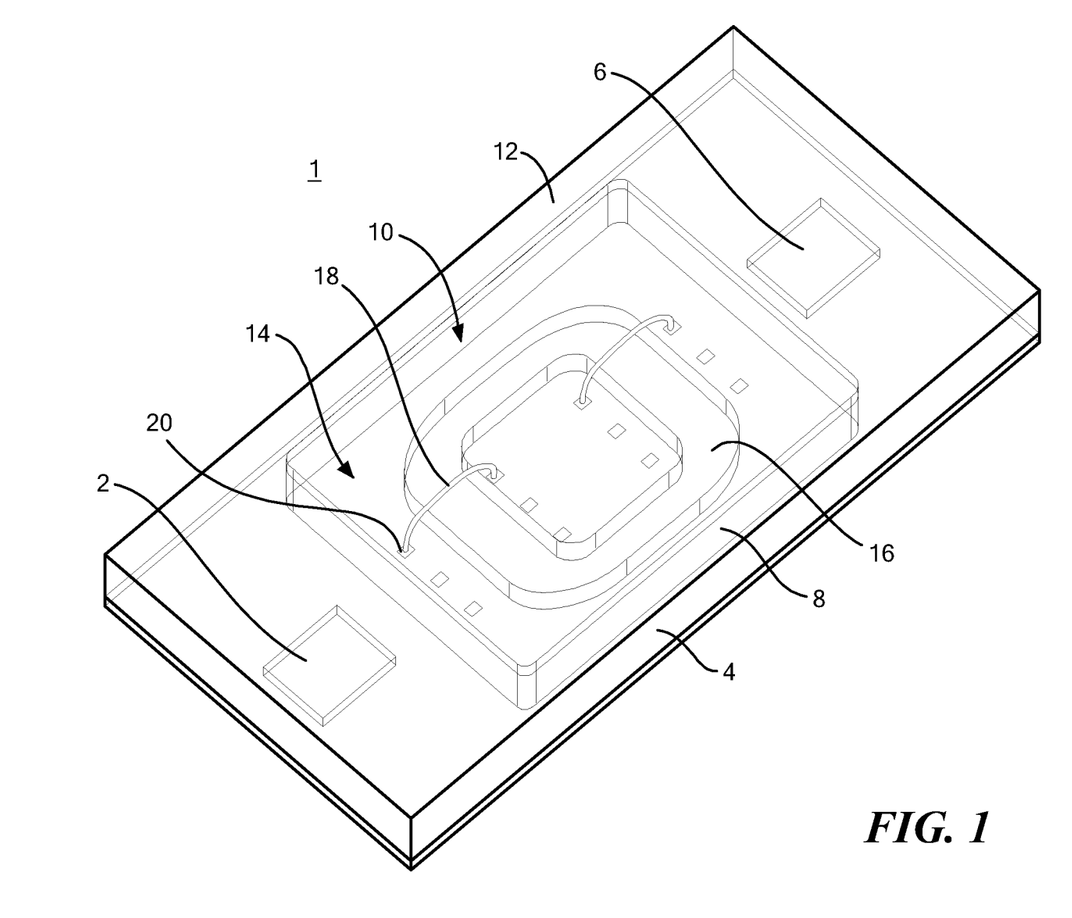
FIG. 1 illustrates an exemplary gate driver compromising of primary & secondary die of the isolated switch driver, ferrite, wire bond windings, substrate and cavity moulding prior to filing with an insulating material.
Figure 2:
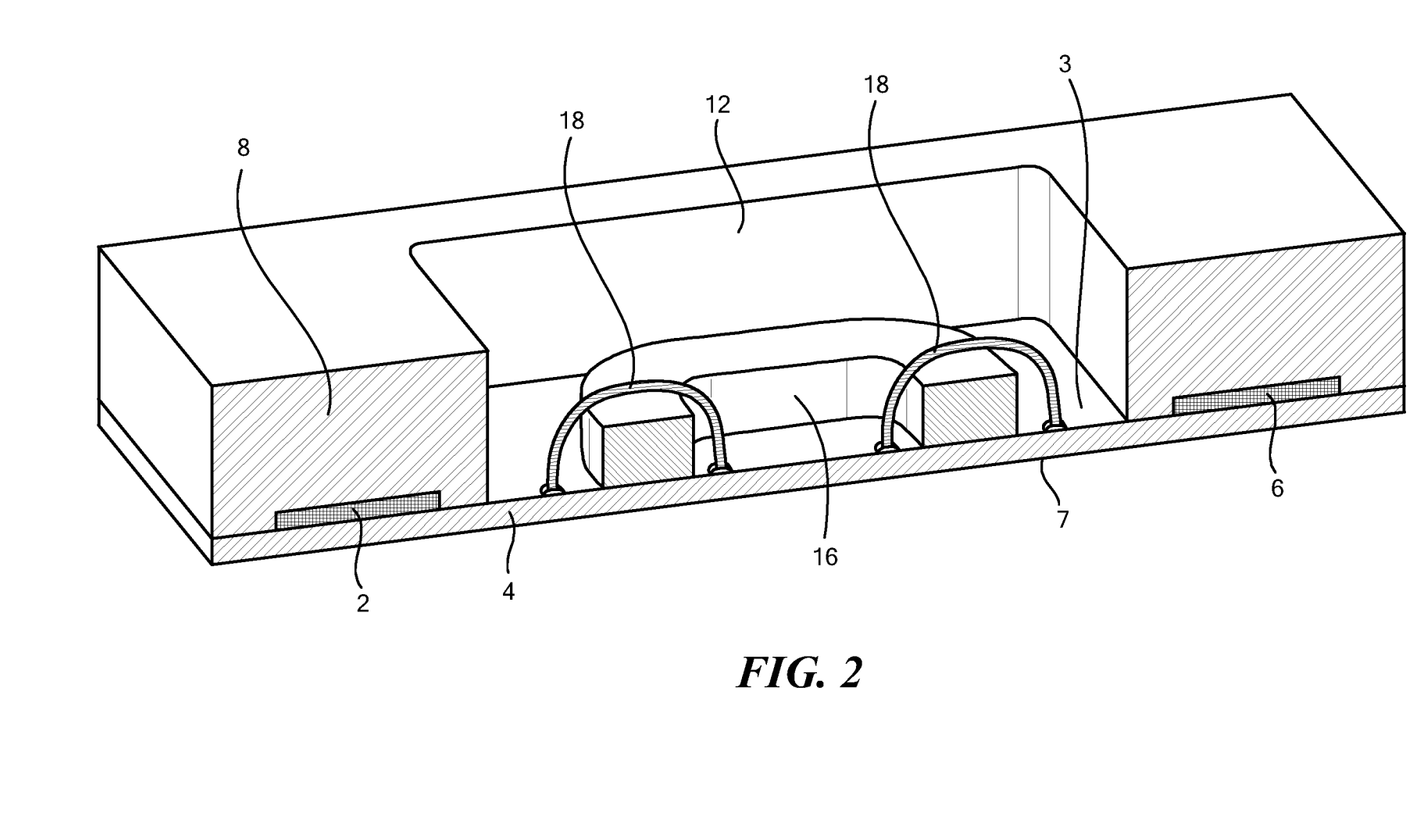
FIG. 2 illustrates a cross section of FIG. 1.
Figure 3:
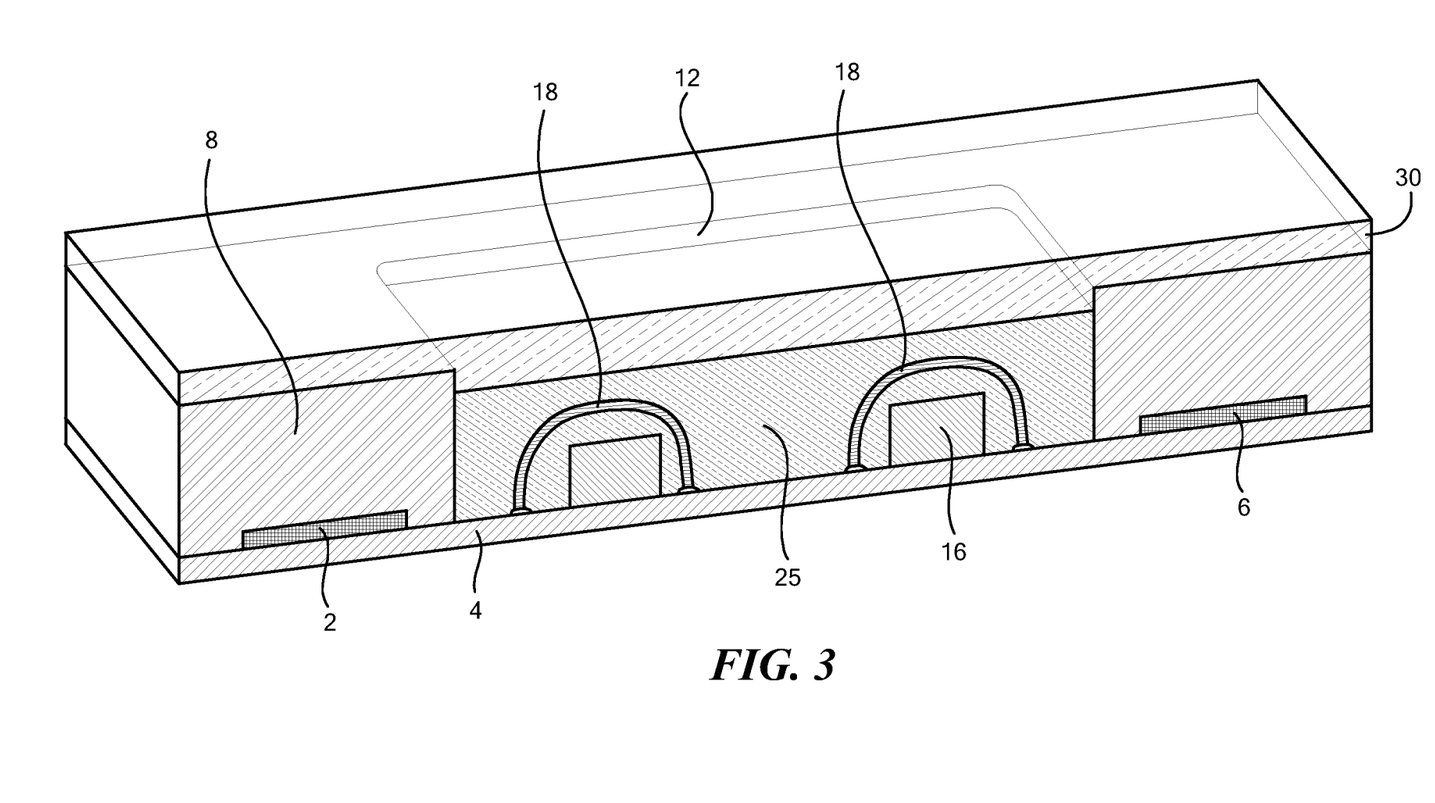
FIG. 3 illustrates a cross section of FIG. 1 with encapsulating material in the cavity moulding.

Referring now to FIGS. 1 to 3 of the accompanying drawings there is illustrated a first embodiment of an isolated gate drive, generally indicated as 100. The isolated gate drive is designed to satisfy isolation and safety requirements and lend itself to a process of industrial manufacturing.

The isolated gate drive is designed to be employed as a component in a larger circuit and in particular to provide a drive signal from a control circuit to control the operation of a semiconductor switch. More specifically, the nature of the isolated gate drive is as generally described in related applications WO2019068932 and WO2018146161, which are co-assigned, the entire contents of which are herein incorporated by reference.

The isolated gate drive is manufactured on a layer of material which provides insulation, serves as a base and provides mechanical protection for the other components of the isolated gate drive.

This layer may hereafter be referred to as the substrate. The substrate has two major surfaces (a first major surface and a second major surface opposing the first major surface). The substrate may, for example, be made from a glass reinforced epoxy laminate material (such as, but not limited to, FR-4).

The substrate may have conductive tracks formed on one or more of the first and second major surfaces and intermediate layers therebetween. At the same time, interconnections may be made by vias as would be familiar to those skilled in the art.

The isolated gate drive employs a transformer with at least two windings. The at least two windings comprise a first winding which may be referred to a primary side winding and a second winding which may be referred to as a secondary side winding.

Circuitry is provided with components forming circuits which are connected to the windings of the transformer. The formed circuits may be defined as a first circuit and a second circuit. The first circuit connects to the primary side winding and hence may be referred to as a primary side circuit and as the second circuit connects to the secondary side winding may be referred to as the secondary side circuit.

For reasons of isolation, as would be familiar to those skilled in the art, the primary and secondary side circuits would be separated from one and other.

Generally speaking, the transformer may be positioned spatially on the substrate in between the primary and secondary side circuits.

As shown in the exemplary package 1 of FIG. 1, the primary side circuit is provided as a single integrated circuit 2 on first major surface 3 of a substrate 4, although it will be appreciated that it may be implemented using discrete components or may comprise discrete components in combination with the integrated circuit. Similarly, there may be more than one integrated circuit. Equally, the secondary side circuit is shown as being provided by a second integrated circuit 6.

External connections (not shown) to the isolated gate drive circuit may be provided using conventional methods of interconnecting components, for example including the use of lead frames or conductive pads provided on the second major surface 7.

The primary and secondary side circuits are covered by a first layer of electrically insulating material 8. The insulating material provides electrical insulation and also physical and environmental protection.

The first layer of a first insulation material extends generally to the sides of the substrate. A space may be left around the edge to accommodate a shell or cap.

The first layer of insulation material acts to define a space (cavity moulding) 10 for accommodating the transformer 14, this space may be referred to as a well. The first layer of insulating material suitably defines the side wall 12 of the well.

The first insulating material may be any suitable encapsulant, examples of which include epoxy, polyester, polyurethane and silicone-based materials as would be familiar to those skilled in the art.

The transformer has a magnetic core 16, which may be a ferrite or similar magnetic material.

The transformer core may be fixed to the first major surface by means of an adhesive or other suitable means.

The primary and secondary windings of the transformer comprise a series of one or more turns for each winding.

Figure 4:
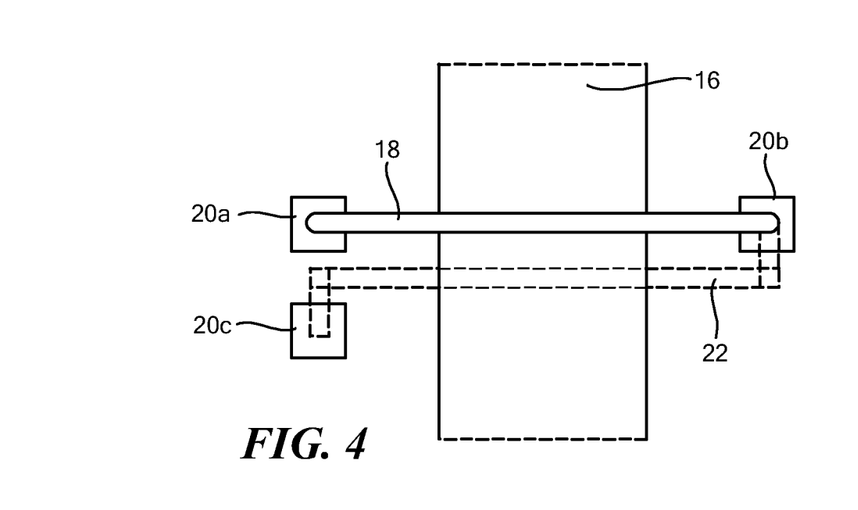
FIG. 4 is a top view illustrating the formation of a turn of a winding of a transformer.
Figure 5:
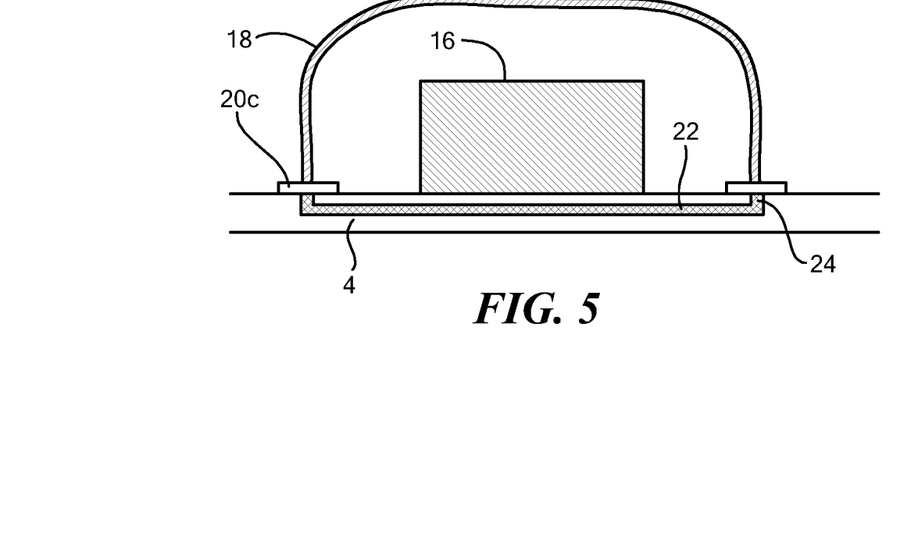
FIG. 5 is a sectional view of FIG. 4.

Each individual turn of the windings is suitably formed using a combination of a conductive track 22 either within or on the substrate and a wirebond connection between landing zones 20, as illustrated in FIGS. 4 and 5. In the exemplary arrangement shown, a turn may be considered to start at a first conductive landing zone 20a or pad on the first major surface of the substrate. A wirebond wire 18 starts from and is wirebonded to this first conductive landing zone which is to one side of a leg of the transformer core 16. The wirebond wire extends over the leg of the transformer core to a second landing zone 20b. The wire is wirebonded to this second landing zone. The second landing zone is on the opposite side of the transformer core leg to the first landing zone.

The wirebond wire may be uninsulated or insulated. The advantage of using insulated wirebond wire is that it improves the isolation performance of the circuit.

A conductive track 22 from the second landing zone 20b (which in the example shown is buried and connected by a via 24) completes the turn by forming a conductive path back to a third landing zone 20c on the other side of the transformer core. It will be appreciated that the winding could continue with a second turn commencing at this third landing zone.

The shape and dimensions of the well are selected to accommodate the transformer core and to allow for the fixing of the wirebond connections. The separation distance from a landing zone to the side wall of the well and from a landing zone to the leg of transformer core will depend on the wire bonding machine employed.

A second layer of insulating material is provided in the well to cover the wirebond connections and transformer core. The surface level of this second layer of insulating material may be at or below the surface level of the first layer of insulating material.

An advantage of deploying a separate second insulating material in a well formed by the first insulating material rather than using a single homogenous layer of insulating material to cover the substrate is that two insulating materials may be selected to have different characteristics.

In particular, a problem with using certain insulating materials is that whilst they are selected to be sufficiently strong to protect the components they surround, when used around a transformer core, they decrease the performance of the magnetic material by restricting vibration.

Additionally, it has been found that the variation in performance of a transformer core embedded in such an insulating material can vary significantly resulting in difficulties in achieving consistent gate drive performance.

Using a separate second insulation material, allows for a softer second insulation material to be used relative to the first insulation material. Suitably, the hardness of the second insulating material is less than 70 on the Shore A scale and more suitably less than 60 on the Shore A scale.

An exemplary such material is a silicone-based material. An example of a suitable silicon-based material is a silicone rubber encapsulant.

A suitable silicone rubber encapsulant is Semicosil 268 Black from Wacker Chemical Corporation of Adrian, Michigan, USA. The durometer of this material is 52 on the Shore A scale.

A cap (not shown) may be provided to cover the first and second layers of insulating material. The cap may be formed from a plastics material. In which case, the cap may comprise a top planar surface with side walls extending downwards. These side walls suitably extend to and cover the sidewalls of the substrate. Alternatively, the cap may be flush with the sidewalls.

The nature of the gate drive circuits of the current application is that they are galvanically isolated circuits for transmitting switch state information as well as powering the circuitry on a floating (secondary) side of the isolation barrier.

As described above the isolated gate drive uses a single magnetic coupling device to achieve both signal as well as power transfer. The magnetic coupling device is a transformer with a simple structure, coupling a single first coil (the first winding) and a single second coil (the second winding) preferably using a suitable magnetically active material such as ferrite in order to achieve good coupling between the coils.

The transformer can be very compact in cross-sectional area and size as only short-duration pulses are transmitted minimizing the volt-second product across the coils.

Signal and power transfer across the isolation barrier are achieved in this configuration such that that the power transfer is scheduled without slowing down the signal transfer. The speed of signal transfer is not sensitive to imperfections in the transformer, such as transformer leakage inductances, and variations in magnetising inductance.

As the transformer can be very compact in size, and the performance of the switch drive circuit is insensitive to the transformer leakage inductance, the transformer lends itself well to full integration into a single component package together with the primary and floating side of the switch drive circuit.

The use of integrated circuits for the primary and second side circuits as detailed above facilitates the nature of the described isolated gate driver using wire bond technology in a high-performance package in a cost-effective manner. The reasonably small size of the ferrite required also allows for the wire bond winding aspect.

Figure 6:
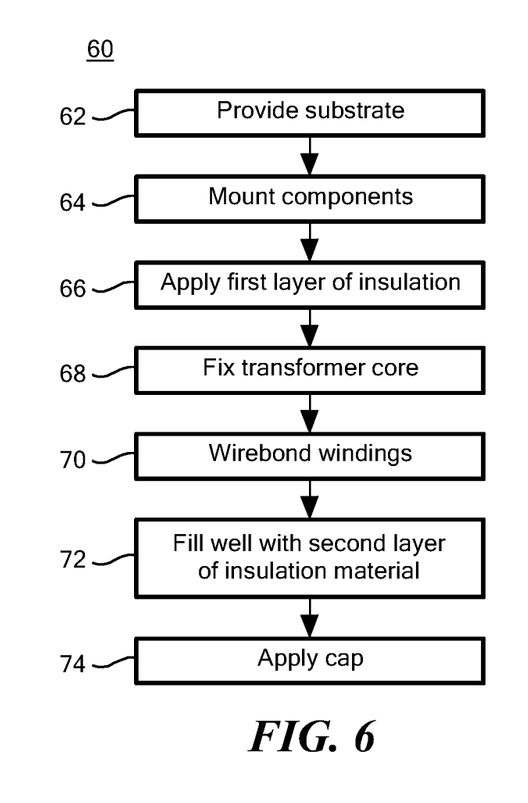
FIG. 6 is a process flow for an exemplary method of manufacturing an isolated gate drive.

An exemplary method 60 of manufacturing an encapsulated gate drive package will now be described.

The method commences with the provision 62 of a substrate on which the required tracks, vias and landing zones have been formed using techniques familiar to those skilled in the art. It will be appreciated that the substrate may be provided as a panel which may be singulated later in the process into individual packages.

A second step comprises mounting of components, for example the first and second integrated circuits, on to the substrate. This step may comprise the initial application of solder paste, followed by placement of the components and fixing by means of passing through an oven.

A third step is to apply the first layer of insulation. This step may be performed by placing the panel in a suitable mold and filling the mold with a liquid encapsulant, which when cured forms the first layer of insulation. Suitably, the mold is shaped to form the well, i.e., the mold prevents the flow of insulation material into the well space.

After the first insulating material has hardened, the transformer core may be fixed to the first major surface of the substrate, using a suitable adhesive.

Once the transformer core has been fixed in situ, a wire bonding machine is employed to provide wire bond wires to complete 70 the transformer windings.

After the wire bond wires are fixed, the well may be filled with a liquid encapsulant to form the second insulating material and allowed to cure.

The well may be filled level with the top of the first insulating material. However, it may be desirable that the level of the top of the second insulating material is lower than the level of the first insulating material. One reason for this is that as the encapsulant is a liquid, as it flows into the well it will form a meniscus. Underfilling the well means that the top of the meniscus will not be higher than the level of the first insulating material.

Additionally, if a cap is provided over the insulating materials as a final step 74, it will ensure a correct fit. Where a cap is employed, a small hole may be provided in the cap in the region of the well to allow air escape when the finished package is fixed as a component to a circuit board and passes through an oven.

This Application disclosure focuses on a novel way to manufacture a packaged galvanically isolated gate drive device and the packaged device itself.

The Application disclosure focuses on magnetic devices using magnetically active material (e.g., ferrite) defining a magnetic flux path. This Application does not relate to "air cores" where no active magnetic material is present as a ferrite core is required to transfer sufficient power across the galvanic isolation to power the secondary side circuitry.

The words comprises/comprising when used in this specification are to specify the presence of stated features, integers, steps or components but does not preclude the presence or addition of one or more other features, integers, steps, components or groups thereof.

In the foregoing specification, the application has been described with reference to specific examples of embodiments. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present application is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Furthermore, those skilled in the art will recognize that boundaries between the functionality of the above-described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. Equally, whilst the claims are directed to an isolated gate drive or reset circuit for same, the application is not to be construed as being so limited and extends to a method for doing same. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. An isolated gate drive comprising:
    a transformer having a core, a primary winding and a secondary winding;
    a substrate having a first major surface and a second major surface opposing the first major surface;
    a first insulating material provided on said substrate, the first insulating material in combination with the first major surface of the substrate defining a well, wherein the first insulating material covers the first major surface outside of the well;
    wherein the core is disposed within the well and one or both of the primary and secondary windings are partially formed by one or more wirebond wires bonded to landing zones on the first major surface; and
    a second insulating material disposed in the well and covering the wirebond wires and core, wherein the second insulating material is softer than the first insulating material.

2. The gate drive of claim 1, wherein the core is fixed to the first major surface with a first adhesive.

3. The gate drive of claim 1, further comprising contacts for making external electrical connections, wherein the contacts are provided on the second major surface of the substrate.

4. The gate drive of claim 1, wherein the wirebond wires are insulated.

5. The gate drive of claim 1, wherein the primary and secondary windings are completed by tracks buried within the substrate.

6. The gate drive of claim 1, further comprising:
   a primary side circuit, wherein the primary side circuit is covered by the first insulating material.

7. The gate drive of claim 6, wherein the primary side circuit includes a first integrated circuit mounted to the first major surface.

8. The gate drive of claim 6, further comprising:
   a secondary side circuit, wherein the secondary side circuit is covered by the first insulating material.

9. The gate drive of claim 8, wherein the secondary side circuit includes a second integrated circuit mounted to the first major surface.

10. The gate drive of claim 9, wherein the primary side circuit is galvanically isolated from the secondary side circuit.

11. The gate drive of claim 10, wherein the gate drive is configured to pass both signals and power from the primary side circuit to the secondary side circuit using the transformer.

12. The gate drive of claim 1, further comprising a cap covering the first insulating material.

\* \* \* \* \*

UNITED STATES PATENT AND TRADEMARK OFFICE
CERTIFICATE OF CORRECTION

PATENT NO. : 12,132,469 B2
APPLICATION NO. : 17/336005
DATED : October 29, 2024
INVENTOR(S) : Andrew Thompson et al.

Page 1 of 1

It is certified that error appears in the above-identified patent and that said Letters Patent is hereby corrected as shown below:

On the Title Page (72) Inventors: delete "Karl Rinne, Cork (GB)" and replace with --Karl Rinne, Cork (IE)--.

Signed and Sealed this
Thirtieth Day of December, 2025

John A. Squires
*Director of the United States Patent and Trademark Office*